United States Patent [19]

Buttle et al.

[11] 3,730,969

[45] May 1, 1973

[54] ELECTRONIC DEVICE PACKAGE

[75] Inventors: Robert Leroy Buttle, Summit; William Douglas Bailey, Somerville, both of N.J.

[73] Assignee: RCA Corporation, New York, N.Y.

[22] Filed: Mar. 6, 1972

[21] Appl. No.: 232,038

[52] U.S. Cl. ............174/52 S, 174/68.5, 174/DIG. 3, 317/101 CP

[51] Int. Cl. ..................................................H01l 5/00

[58] Field of Search .........................174/52 S, 52 PE, 174/68.5, DIG. 3; 317/101 CP, 101 CM

[56] References Cited

UNITED STATES PATENTS

| | | | |
|---|---|---|---|
| 3,220,095 | 11/1965 | Smith | 174/52 S X |
| 3,311,798 | 3/1967 | Gray | 174/52 S |
| 3,495,023 | 2/1970 | Hessinger et al. | 174/52 S |
| 3,549,784 | 12/1970 | Hargis | 174/68.5 |
| 3,601,522 | 8/1971 | Lynch | 174/68.5 |
| 3,617,817 | 11/1971 | Koganei-shi et al. | 174/52 S |
| 3,634,600 | 1/1972 | Griffin | 174/52 S |
| 3,659,035 | 4/1972 | Planzo | 174/52 PE |

OTHER PUBLICATIONS

Finch et al, Integrated Circuit Interconnection Packaging IBM Technical Dis. Bull. Vol. 13, No. 4 Sept. 1970.

Ross, R. F., Packaging Integrated Circuit, IBM Tech Dis. Bull, Vol. 13, No. 9 Feb. 1971.

*Primary Examiner*—Bernard A. Gilheany
*Assistant Examiner*—A. T. Grimley
*Attorney*—G. H. Bruestle et al.

[57] ABSTRACT

An electronic device package comprises a ceramic top card having an opening therethrough and at least one other card including a ceramic pattern card on which an electronic device is mountable having a film pattern of electrical leads on an upper surface thereof. The pattern card is laminated to the top card and has a plurality of holes therethrough. Each hole communicates with an electrical lead and is interiorly plated with an electrically conductive film. A pin is brazed to the conductive film in each hole and to a corresponding electrical lead.

10 Claims, 4 Drawing Figures

ELECTRONIC DEVICE PACKAGE

BACKGROUND OF THE INVENTION

This invention relates to electronic device packages and to methods for attaching pins thereto. More particularly it relates to an electronic device ceramic package having a conductive pattern of electrical leads incorporated internally into the ceramic structure and to a pin attachment method for binding electrical lead pins to the package.

Performance of most electronic devices, such as solid state devices, is affected by the environmental conditions to which the devices are exposed. Therefore, to achieve optimum performance of an electronic device, it is necessary to shield the device from as many enviornmental conditions as possible. Such shileding can be accomplished by sealing the electronic device into a suitable enclosure or package that includes appropriate electrical leads to interconnect the device to an electrical circuit. Typical materials used for early package construction included various plastics and glasses. Plastic packages proved unsuitable for many applications since they could not meet specifications requiring high temperature and hermeticity. Although glass packages can meet these temperature and hemeticity requirements, they provide low resistance to mechanical stress and thermal shock. Therefore, since plastic and glass packages were unsatisfactory for many applications, the electronic device packaging art began to develop ceramic packages to overcome the disadvantages inherent in prior art packages.

Although ceramic packages are presently being produced that provide substantial advantages over previously constructed packages, most ceramic packages still have disadvantages that limit their use. For example, in some packages the conductive leads and/or the upper portion of the electrical lead pins are exposed on the top of the package when the package is plugged into a circuit. In these packages, the leads and pins exposed at the top of the package can be shorted easily when a conductive foreign particle settles on the package. This exposure of the leads and upper portions of the pins also may cause them to deteriorate rapidly in an adverse environment. Another disadvantage many ceramic packages share is frequent pin failure. Such failure usually occurs when the pins are inserted into a receptive connector and is generally caused by pin misalignment with their respective receptive holes.

SUMMARY OF THE INVENTION

An electronic device package comprises a ceramic top card having an opening therethrough, a ceramic pattern card on which an electronic device is mountable, the ceramic pattern card being laminated to the ceramic top card, and a plurality of pins. The ceramic pattern card includes a film pattern of electrical leads on an upper surface thereof and a plurality of holes therethrough, each hole communicating with a corresponding electrical lead. Each pin is positioned within one hole of the plurality of holes and attached to the pattern card and electrically interconnected to one corresponding electrical lead.

THE DRAWINGS

DETAILED DESCRIPTION

Figure 1:
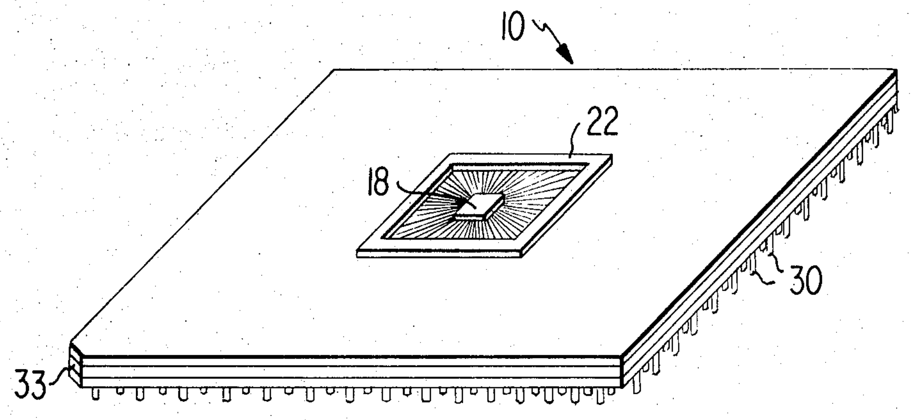
FIG. 1 is a perspective view of an electronic device package.
Figure 2:
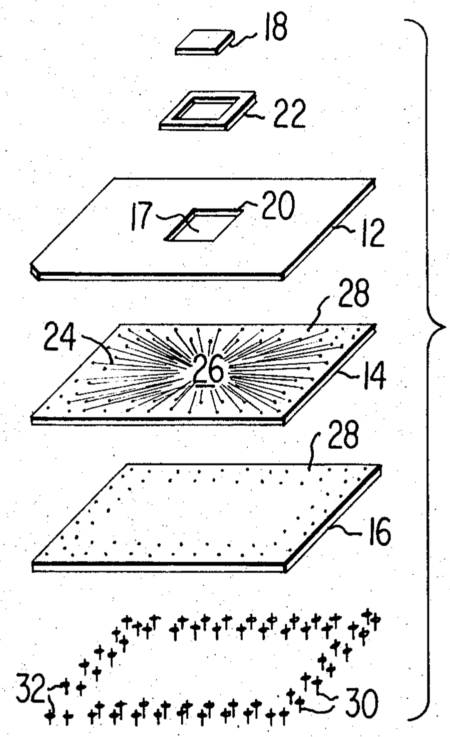
FIG. 2 is an exploded perspective view of the package of FIG. 1.

An electronic device package 10 is shown assembled in FIG. 1 and disassembled in FIG. 2. This particular embodiment is formed with three parallel laminated cards: a top card 12, a pattern card 14 and a bottom card 16. Each card is fabricated from a flexible ceramic tape that may be manufactured under a known process.

The header or top card 12 is formed with a central opening 17 therethrough to provide access for mounting an electronic device 18 such as a monolithic semiconductor integrated circuit chip. A metallized seal flange pattern 20 is formed on the upper surface of the top card around the opening 17 and a metal flange 22 is brazed thereto. Such a metallized pattern may be formed by a process known as silk-screening wherein a conductive metal ink, such as molybdenum-manganese, is applied through a close mesh stainless steel wire screen (e.g., 250 wires per inch). It should be noted, however, that other metallizing techniques such as masking or photoetching may also be used.

The middle or pattern card 14 has an appropriate electrical lead pattern 24 on the upper surface thereof. This pattern 24 is also of a suitable conductive material, such as molybdenum-manganese, that may be silk-screened onto the pattern card. As shown in FIG. 2, the lead pattern 24 may be an array of radially extending metallized portions. However, various lead patterns such as those that radially expand as the edge of the card is approached are preferred since they provide greater area in which to contact the pattern. The central ends of the pattern 24 terminate a distance from the center of the card to provide an area 26 for mounting the electronic device 18 directly on the center of the pattern card 14.

The bottom card 16 is a plain ceramic card that adds to the thickness of the package 10 and thereby increases package strength and rigidity. Both the pattern card 14 and the bottom card 16 have an array of holes 28 that extend through the two cards in an aligned relationship and pierce respective conductive leads on the pattern card. The interior surfaces of these holes are metallized with a conductive material, such as molybdenum-manganese, that interconnects with the lead pattern to provide a continuation of the conductive lead pattern into the holes.

A pin 30 (e.g., kovar 0.018 inch diameter — 0.180 long pin) is mounted in each hole and attached to the metallized layer in each hole by braze. In FIG. 2 the braze is shown as preformed rings 32 which may be used in the actual construction of the package.

A notch 33 may be formed at one of the corners of the package 10, or at an appropriate position if the package is round, to aid in determining the orientation of the package and electronic device after the package has been sealed.

The exposed surfaces of the pins 30, the metal flange 22, the exposed portion of the pattern 24 and the exposed braze 32a and 54 are plated with a suitable corrosion resistant material, such as nickel, gold or combinations thereof.

The electronic device 18 may be hermetically sealed in the package 10 by an appropriately shaped cap (not shown) that may be either welded or soldered to the top of the flange 22.

Figure 3:
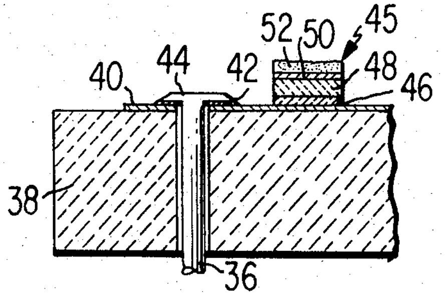
PRIOR ART FIG. 3
FIG. 3 is a partial sectional side view of a prior art electronic device package.
Figure 4:
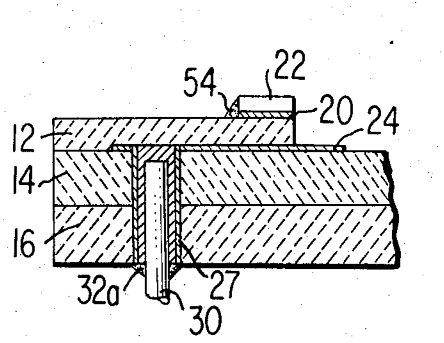
FIG. 4 is a partial sectional side view of the package of FIG. 1.

FIG. 3 shows a prior art pin mounting design and FIG. 4 shows one possible pin mounting arrangement in accordance with the present invention. It can be seen that a metal pin 36 in FIG. 3 extends through a ceramic package 38 and is exposed at the top of the package. The pin 36 is attached to a metallized pattern 40 on the package 38 by a braze 42 that encompasses the periphery and runs under a cap portion 44 of the pin 36. In contrast to this prior art package, in the present embodiment, shown in FIG. 4, the top of pin 30 and the metallized pattern 24 are sealed by the top card 12. Such sealing eliminates any chance of accidental electrical shorting that may occur with the prior art devices and permits better solid state device performance even during inclement enviornmental conditions.

FIGS. 3 and 4 also show two of several types of flange units that may be used with ceramic packages. In FIG. 3, a flange unit 45 comprises a layered structure having a glass seal 46 seated on the metallized pattern 40, a ceramic layer 48 with a metallized surface 50 on top of the glass seal 46 and a solder ring 52 on top of the metallized surface 50. Since the uppermost surface of the present embodiment is ceramic, there is no need to use the complex flange unit 45 to isolate the flange from a conductive pattern and so preferably, a flange 22 is simply attached to the metal flange pattern 20 on the top card 12 by a thin layer of braze 54.

It has been found that the greatest stress on package pins occurs when the pins are inserted into the holes of an appropriate receiving plug. Such stress develops when the pins are slightly bent and do not properly align with the receptive holes. In the prior art package of FIG. 3, such pin misalignment causes the inserting force to concentrate as a tension stress in the braze 42 and on the metallized pattern 40. This tension often results either in failure of the braze 42 or causes the metallizing 40 to break loose from the ceramic package 38. In the embodiment of FIG. 4, however, the inserting force results in a shear force exerted along a braze (32*a*)-metallizing (27)-ceramic (14 and 16) interface in the hole and in compression of the braze 32*a* above the pin 30 against the ceramic header 12. The resistance to such a shear force is greater than the tension stress that can be tolerated by the prior art design. Pin failure is therefore minimized with the present embodiment.

Filling the holes 28 with the braze 32*a* not only provides strength and an efficient conductive path between the pins and the metallized pattern, but also seals the voids around the pins, which are present in the prior art, thereby eliminating areas wherein corrosive fluxes may be trapped. The continuous ceramic surface of header 12 also provides high thermal shock resistance since there are no through holes in the header structure.

We claim:

1. An electronic device package comprising:
a ceramic top card having an opening therethrough;
a ceramic pattern card on which an electronic device is mountable, said pattern card having a film pattern of electrical leads on an upper surface thereof and a plurality of holes therethrough, each hole communicating with a corresponding electrical lead, and said pattern card being laminated to said top card;
a plurality of pins, each pin positioned within one hole of said plurality of holes and attached to said pattern card and electrically interconnected to one corresponding electrical lead, and
said top card overlaying all of said holes in said pattern card.

2. The electronic device package as defined in claim 1 wherein said ceramic pattern card is plated with conductive metal films on the interior walls forming said holes.

3. The electronic device package as defined in claim 2, wherein said pins are mechanically attached to the metal films on said interior walls and interconnected to said electrical leads by braze material.

4. The electronic device package as defined in claim 3, wherein said braze material fills the portion of said holes between said pins, said interior walls and said film pattern of electrical leads.

5. The electronic device package as defined in claim 1, including at least one ceramic bottom card laminated to said pattern card and having a pluraliy of holes therethrough corresponding to, and aligned with, the plurality of holes in said pattern card, and
each of said pins extending through a different one of said holes in said bottom card.

6. The electronic device package as defined in claim 1, including a metal film flange pattern on an upper surface of said top card surrounding said opening, and a metal flange attached to said flange pattern.

7. The electronic device package as defined in claim 6, including an electronic device connected to said pattern of electrical leads and a cover attached to said metal flange.

8. The electronic device package as defined in claim 7, wherein said cover enclosing said electronic device is hermetically sealed to said metal flange.

9. An electronic device package comprising:
an electronic device;
a ceramic top card having an opening therethrough;
a ceramic pattern card on which said electronic device is mounted, said pattern card having a film pattern of electrical leads on an upper surface thereof and a plurality of holes therethrough, each hole communicating with a corresponding electrical lead, said pattern card being laminated to said top card, said top card overlaying all of said holes in said pattern card, and said electronic device being interconnected to said electrical lead; and
a plurality of pins, each pin positioned within one hole of said plurality of holes and attached to said pattern card and electrically interconnected to one corresponding electrical lead.

10. An electronic device package comprising:
an electronic device;
a ceramic top card having a central opening therethrough and a metal flange pattern on an upper surface thereof surrounding said opening;
at least one ceramic lower card laminated to said top card, said lower card having a film pattern of electrical leads on an upper surface thereof and a plurality of holes therethrough, each hole underlying said top card and communicating with a corresponding electrical lead, said electronic device being mounted on the upper surface of said lower card in the central opening of said top card and interconnected to said electrical leads, the interior surfaces of said lower card forming said holes being plated with conductive metal films;

a plurality of pins, each pin positioned within one hole and attached to said metal films on the interior surfaces of said lower card, and each pin electrically interconnected to one corresponding electrical lead; and a metal flange attached to said flange pattern on said top card.

* * * * *